United States Patent
Kobayashi (10) Patent No.: US 8,274,337 B2
(45) Date of Patent: Sep. 25, 2012

(54) DIGITAL PHASE LOCKED LOOP

(75) Inventor: Hiroyuki Kobayashi, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 49 days.

(21) Appl. No.: 12/833,634

(22) Filed: Jul. 9, 2010

(65) Prior Publication Data

US 2011/0215872 A1  Sep. 8, 2011

(30) Foreign Application Priority Data

Mar. 5, 2010  (JP) .................................. 2010-049517

(51) Int. Cl.
*H03L 7/099* (2006.01)

(52) U.S. Cl. ................. 331/2; 331/1 A; 331/17; 327/147

(58) Field of Classification Search .................. 331/1 A, 331/1 R, 2, 17, 25, 46, 49; 327/156, 159, 327/147, 145, 150; 375/376
See application file for complete search history.

(56) References Cited

U.S. PATENT DOCUMENTS

| | | | | |
|---|---|---|---|---|
| 6,326,851 | B1 * | 12/2001 | Staszewski et al. ............. | 331/17 |
| 7,405,627 | B2 * | 7/2008 | Shimomura et al. ............. | 331/2 |
| 2002/0070811 | A1 * | 6/2002 | Skierszkan ..................... | 331/1 A |
| 2009/0219073 | A1 | 9/2009 | Sun et al. | |

FOREIGN PATENT DOCUMENTS

JP  2009-177685  8/2009

OTHER PUBLICATIONS

R. B. Stazewski et al., "All-Digital PLL and Transmitter for Mobile Phones," IEEE Journal of Sold-State Circuits, vol. 40, No. 12, pp. 2469-2482, Dec. 2005.
Japanese Office Action for corresponding Japanese Patent Application No. 2010-049517 dated May 8, 2012, in 6 pages.
Sylla, Iboun Taimiya, "Building an RF source for low cost testers using an ADPLL controlled by Texas Instruments Digital Signal Processor (DSP) TMS320C5402", RF Wireless Product & Test group, Texas Instruments Inc. ITC International Test Conference, IEEE, 2003, Paper 26.2 pp. 659-664.

* cited by examiner

*Primary Examiner* — Ryan Johnson
(74) *Attorney, Agent, or Firm* — Knobbe, Martens, Olson & Bear LLP (57) ABSTRACT

A semiconductor integrated circuit includes: digitally controlled oscillators; a phase-data output unit; an integration processing unit; a filter unit; a multiplier (a first multiplier) that outputs, as an oscillator tuning word, a value obtained by multiplying an output signal subjected to time division from the filter unit with a predetermined coefficient; and an output selector (a tuning-word separating unit) that allocates the oscillator tuning word to the digitally controlled oscillators in synchronization with a reference frequency.

19 Claims, 10 Drawing Sheets

DIGITAL PHASE LOCKED LOOP

CROSS-REFERENCE TO RELATED APPLICATIONS

This application is based upon and claims the benefit of priority from the prior Japanese Patent Application No. 2010-049517, filed on Mar. 5, 2010; the entire contents of which are incorporated herein by reference.

BACKGROUND OF THE INVENTION

1. Field of the Invention

The present invention relates to semiconductor integrated circuit that controls an oscillation frequency, and, more particularly to an all digital phased locked loop (ADPLL).

2. Description of the Related Art

In an intelligent integrated circuit (IC) in recent years, functions are integrated on the IC. It is not rare that a plurality of phase locked loops (PLLs) are mounted on the IC to allow the entire IC to operate with a single external clock. For example, when a desired clock is integer times as high as the external clock, a plurality of frequencies can be extracted from one oscillator. However, when a desired clock is not integer times as high as the external clock, a plurality of PLLs are necessary in a chip. Therefore, an area of the chip increases. It is becoming a general practice to mix, in a chip, a loop filter included in a PLL. In particular, an analog PLL in the past requires a large loop filter to prevent unnecessary radiation such as spurious radiation when a reference frequency is low or when low-frequency resolution of an oscillation frequency is requested. This causes an increase in a chip area. Therefore, when a plurality of PLLs are mounted on a chip, a further increase in a chip area is caused. In this way, an increase in functions and a reduction in a chip area are in a tradeoff relation.

To solve such a problem, for example, in a related art represented by JP-A. 2009-177685 (KOKAI), an ADPLL is used in which a reduction in a chip area is realized by replacing most of functions of a PLL with digitally-controlled functions.

However, an arithmetic unit occupies a large area in the ADPLL. When a plurality of the ADPLLs are used, a chip area increases in proportion to required specifications. Therefore, it is difficult to meet a need for a further reduction in a chip area.

BRIEF SUMMARY OF THE INVENTION

A semiconductor integrated circuit according to an embodiment of the present invention comprises an oscillation-frequency-signal generating unit that includes a plurality of digitally controlled oscillators, oscillation frequencies of oscillation signals of which are controlled according to an oscillator tuning word; phase-data output units that output a plurality of phase data that are added-up values of count values obtained by counting numbers of waves of the oscillation signals and phase differences between the oscillation frequencies of the oscillation signals and a reference frequency; an integration processing unit that outputs an integration value of frequency setting data of the digitally controlled oscillators in synchronization with the reference frequency; a filter unit that filters a difference value between the phase data from the phase-data output units and the integration value from the integration processing unit in synchronization with the reference frequency; and a gain adjusting unit that outputs a value obtained by multiplying an output signal from the filter unit with a predetermined coefficient to the oscillation-frequency-signal generating unit as the oscillator tuning word in synchronization with the reference frequency.

A semiconductor integrated circuit comprises an oscillation-frequency-signal generating unit that includes a first digitally controlled oscillator, an oscillation frequency of an oscillation signal of which is controlled according to a first oscillator tuning word and a second digitally controlled oscillator, an oscillation frequency of a second signal of which is controlled according to a second oscillator tuning word;

phase-data output units that output first and second phase data that are added-up values of a count value obtained by counting a number of waves of the first or second oscillation signal and a phase difference between the oscillation frequency of the first or second oscillation signal and a reference frequency;

an integration processing unit that outputs first and second integration values of first and second frequency setting data in synchronization with the reference frequency;

a filter unit that filters a difference value between the first or second phase data and the first or second integration value in synchronization with the reference frequency; and a gain adjusting unit that outputs values obtained by multiplying an output signal from the filter unit with first and second coefficients to the first and second digitally controlled oscillators as the first and second oscillator tuning words.

A semiconductor integrated circuit comprises an oscillation-frequency-signal generating unit that includes a first digitally controlled oscillator, an oscillation frequency of an oscillation signal of which is controlled according to a first oscillator tuning word and a second digitally controlled oscillator, an oscillation frequency of a second signal of which is controlled according to a second oscillator tuning word;

phase-data output units that output phase data that are added-up values of a first or second count value obtained by counting a number of waves of the first or second oscillation signal and a phase difference between a third oscillation frequency based on the first and second oscillation frequencies and a reference frequency;

an integration processing unit that outputs first and second integration values of first and second frequency setting data in synchronization with the reference frequency;

a filter unit that filters a difference value between the first or second phase data and the first or second integration value in synchronization with the reference frequency; and a gain adjusting unit that outputs values obtained by multiplying an output signal from the filter unit with first and second coefficients to the first and second digitally controlled oscillators as the first and second oscillator tuning words.

DETAILED DESCRIPTION OF THE INVENTION

Exemplary embodiments of semiconductor integrated circuit according to the present invention will be explained below in detail with reference to the accompanying drawings. The present invention is not limited to the following embodiments.

First Embodiment

Figure 1:
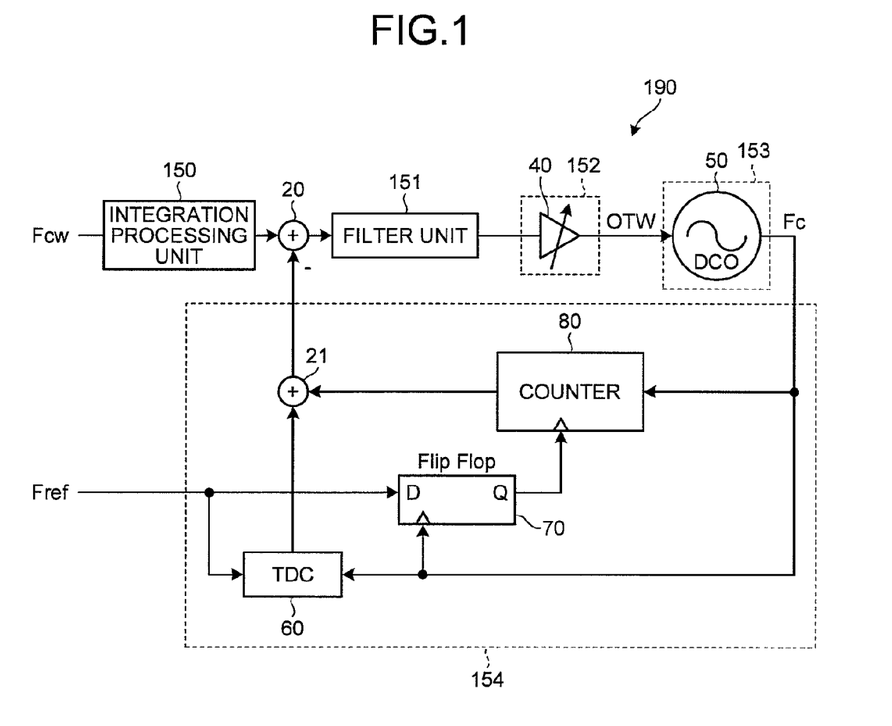
FIG. 1 is a diagram illustrating the basic configuration of an ADPLL according to an embodiment of the present invention.
Figure 2:
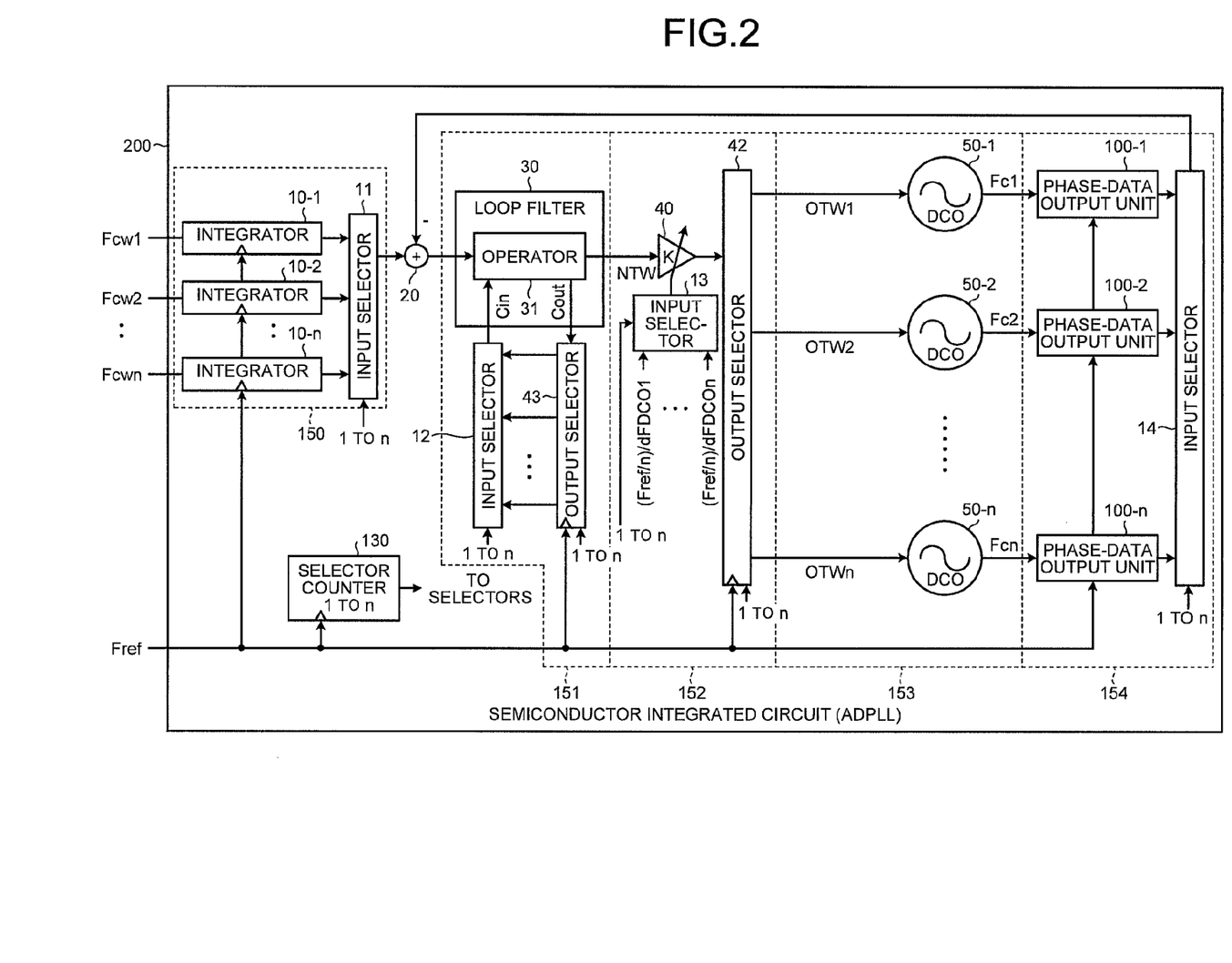
FIG. 2 is a detailed diagram illustrating a semiconductor integrated circuit including the ADPLL shown in FIG. 1.

FIG. 1 is a diagram illustrating the basic configuration of an ADPLL according to a first embodiment of the present invention. FIG. 2 is a detailed diagram illustrating a semiconductor integrated circuit including n systems of the ADPLL shown in FIG. 1.

In FIG. 1, an ADPLL 190 includes an integration processing unit 150, an adder 20, a filter unit 151, a gain adjusting unit 152, an oscillation-frequency-signal generating unit 153, and a phase-data output unit 154.

The gain adjusting unit 152 includes a multiplier (a first multiplier) 40. The oscillation-frequency-signal generating unit 153 includes a digitally controlled oscillator (DCO) 50. The phase-data output unit 154 includes an adder 21, a time to digital converter (TDC) 60 as a phase-difference calculating unit, a counter 80, and a flip-flop (hereinafter, "FF") 70.

An oscillation frequency Fc of an oscillation signal of the digitally controlled oscillator (hereinafter, "oscillator") 50 is controlled according to an oscillator tuning word (OTW) as a discrete value.

A reference frequency Fref is input to a data terminal D of the FF 70. An oscillation frequency Fc is input to a clock terminal of the FF 70. The FF 70 outputs, from an output terminal Q, a reference signal synchronized with the oscillation signal from the oscillator 50. The counter 80 counts the number of waves of the oscillation signal and outputs a count value of the number of waves in synchronization with the reference signal from the FF 70. When a value of the counter 80 operating according to an oscillator output (the oscillation signal) is output for each of references, the oscillation signal and the reference signal are asynchronous with each other. Therefore, when edges of clocks of the signals are close to each other, it is likely that a correct value of the counter 80 cannot be obtained. To prevent this problem, the FF 70 once synchronizes the reference signal with the oscillation signal. As a result, a correct value of the counter 80 can be acquired.

The TDC 60 generates data equal to or smaller than one period of the oscillation frequency Fc and calculates a phase difference between the reference frequency Fref and the oscillation frequency Fc. The adder 21 outputs phase data obtained by adding up the count value from the counter 80 and the phase difference from the TDC 60.

The integration processing unit 150 integrates frequency setting data Fcw and outputs an integration value. The frequency setting data Fcw is obtained by dividing the oscillation frequency Fc by the reference frequency Fref. The adder 20 outputs a difference value obtained by subtracting the integration value from the phase data. The filter unit 151 filters the difference value from the adder 20 and outputs a predetermined tuning word. The multiplier 40 outputs an oscillator tuning word OTW obtained by multiplying the tuning word from the filter unit 151 with a predetermined coefficient.

For example, when the oscillation frequency Fc is larger than the frequency setting data Fcw, the multiplier 40 outputs the oscillator tuning word OTW for lowering the oscillation frequency Fc. Specifically, because the phase difference increase when there is shift in the oscillation frequency Fc, the oscillation frequency Fc is controlled to suppress the shift.

A semiconductor integrated circuit (ADPLL) 200 shown in FIG. 2 includes the integration processing unit 150, the adder 20, the filter unit 151, the gain adjusting unit 152, the oscillation-frequency-signal generating unit 153, the phase-data output unit 154, and a selector counter 130. Among the components of the semiconductor integrated circuit 200 shown in FIG. 2, the integration processing unit 150, the adder 20, the filter unit 151, the gain adjusting unit 152, the oscillation-frequency-signal generating unit 153, and the phase-data output unit 154 correspond to the components of the ADPLL 190 shown in FIG. 1.

The selector counter 130 outputs select values (selection signals) 1 to n, which are synchronized with the reference frequency Fref, to input selectors and output selectors explained later.

The integration processing unit 150 includes a plurality of integrators 10-1 to 10-n, i.e., one integrator 10-1 and the other integrators 10-2 to 10-n, and an input selector (an integration-value switching unit) 11. The integrators 10-1 to 10-n respectively integrate frequency setting data Fcw1 to Fcwn in synchronization with the reference frequency Fref and output integration values. The input selector 11 outputs an integration value corresponding to the select values 1 to n as an integration value subjected to time division.

The adder 20 outputs a difference value between the phase data from the phase-data output unit 154 and the integration value from the integration processing unit 150.

The filter unit 151 includes a loop filter 30, an output selector 43, and an input selector 12. The loop filter 30 functions as an operator that outputs the difference value from the adder 20 as a normalized tuning word (NTW). The difference value from the adder 20 is input to the output selector 43. When the reference frequency Fref is at H, the output selector 43 updates the difference value corresponding to the select values 1 to n and stores the updated value. The input selector 12 outputs a value corresponding to the select values 1 to n to the loop filter 30. Because the filter unit 151 has an integral operation function, it is necessary to refer to previous data in controlling oscillators 50-1 to 50-n. The output selector 43 stores an arithmetic operation result used for the oscillators 50-1 to 50-n. The input selector 12 reads out stored data necessary for an arithmetic operation selected according to the select values 1 to n.

The gain adjusting unit 152 includes an input selector (a coefficient switching unit) 13, the multiplier 40, and an output selector (a tuning-word separating unit) 42. The input selector 13 outputs a coefficient (Fref/n)/dFDCO corresponding to the select values 1 to n to the multiplier 40. Fref represents a reference frequency and n represents the number of systems. dFDCO is set for each of the oscillators 50 and represents a frequency change amounts per one code of the oscillator 50. For example, when a change amount of the oscillation frequency Fc of the oscillator 50 is 50 kHz/code and the reference frequency Fref is 13 MHz, a gain for changing the oscillation frequency Fc by 13 MHz when the frequency setting data Fcw changes by one code is necessary. In this case, a value of dFDCO is 260 (13 MHz/50 KHz). The reference frequency Fref is set to 1/n to make a gain from the loop filter 30 equivalent. In this way, the input selector 13 switches a coefficient corresponding to the select values and outputs the coefficient to the multiplier 40. The multiplier 40 outputs an oscillator tuning word OTW obtained by multiplying the normalized tuning word (an output signal) NTW from the filter unit 151 with the coefficient from the input selector 13. The output selector 42 outputs oscillator tuning values OTW1 to OTWn from the multiplier 40 in synchronization with the reference frequency Fref.

The oscillation-frequency-signal generating unit 153 includes the plurality of oscillators 50-1 to 50-n, i.e., one digital oscillator 50-1 and the other digital oscillators 50-2 to 50-n.

The phase-data output unit 154 includes a plurality of phase-data output units 100-1 to 100-n and an input selector (a phase-data switching unit) 14. The phase-data output units 100-1 to 100-n is equivalent to the phase-data output unit 154 shown in FIG. 1. The phase-data output units 100-1 to 100-n output phase data that is added-up values of count values and phase differences. The input selector 14 switches the phase data corresponds to the select values 1 to n and outputs desired phase data to the adder 20.

Figure 3:
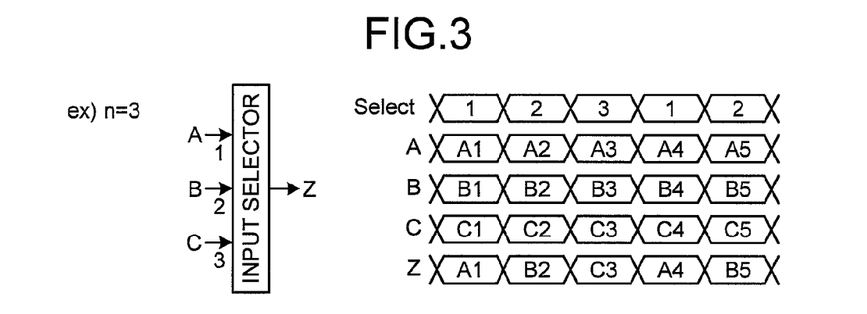
FIG. 3 is a diagram for explaining the operation of each of input selectors.

FIG. 3 is a diagram for explaining the operation of each of the input selectors. In an example shown in the figure, three signals are input. The input selector outputs a signal Z corresponding to the select values 1 to n. For example, when the select value is "1", the input selector outputs a value "A1" of an input node "A".

Figure 4:
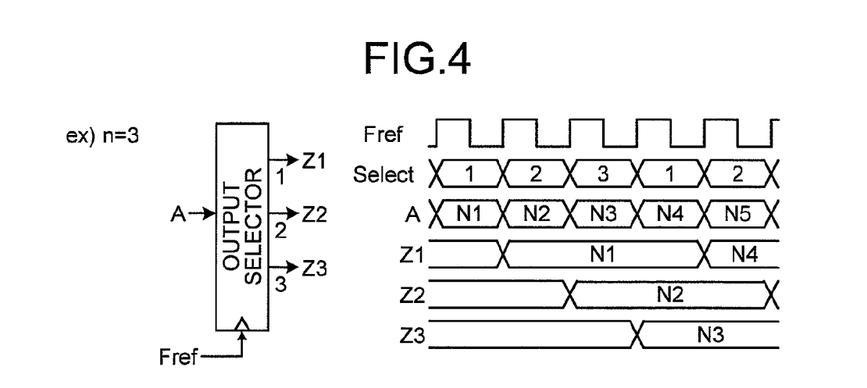
FIG. 4 is a diagram for explaining the operation of each of output selectors.

FIG. 4 is a diagram for explaining the operation of each of the output selectors. The output selector has a data storing function for updating values of output nodes Z1 to Z3 corresponding to the select values 1 to n when the reference frequency Fref is at H. For example, a value of the output node "Z1" corresponding to the reference frequency Fref at H and the select value of "1" is updated to data N1 of the input signal A and stored.

The operation of the semiconductor integrated circuit 200 shown in FIG. 2 is explained below. In the integration processing unit 150, the input selector 11 subjects an integration value of the frequency setting data Fcw1 to Fcwn integrated by the integrators 10-1 to 10-n to time division in the input selector 11 and outputs the integration value to the adder 20.

In the phase-data output unit 154, the input selector 14 subjects phase data from the phase-data output units 100-1 to 100-n to time division and outputs the phase data to the adder 20.

The adder 20 outputs a difference value obtained by subtracting the integration value from the phase data to the filter unit 151.

The filter unit 151 filters the difference value and outputs the difference value to the gain adjusting unit 152 as the normalized tuning word NTW.

The gain adjusting unit 152 multiplies the normalized tuning word NTW with the coefficient from the input selector 13 and allocates the normalized tuning word NTW to the oscillators 50-1 to 50-n as the oscillator tuning words OTW1 to OTWn. The oscillators 50-1 to 50-n output oscillation frequencies Fc1 to Fcn not correlated to one another.

As explained above, in the semiconductor integrated circuit 200 according to the present invention, the filter unit 151 and the gain adjusting unit 152 are commonly used in the ADPLL including a plurality of systems to control timing of output. Therefore, the semiconductor integrated circuit 200 can output the oscillation frequencies Fc1 to Fcn not correlated to one another.

Figure 5:
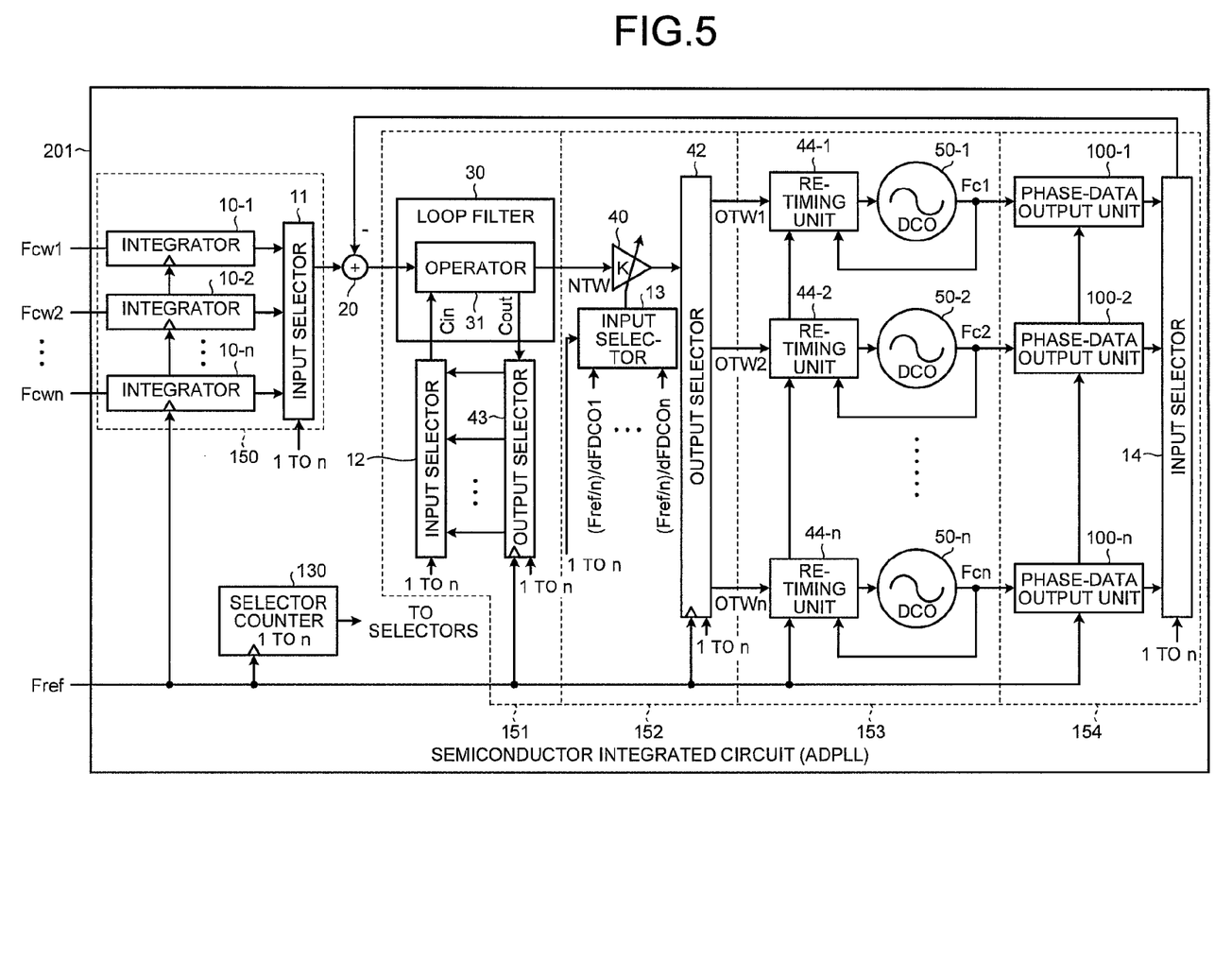
FIG. 5 is a diagram illustrating a semiconductor integrated circuit including a retiming unit.
Figure 6:
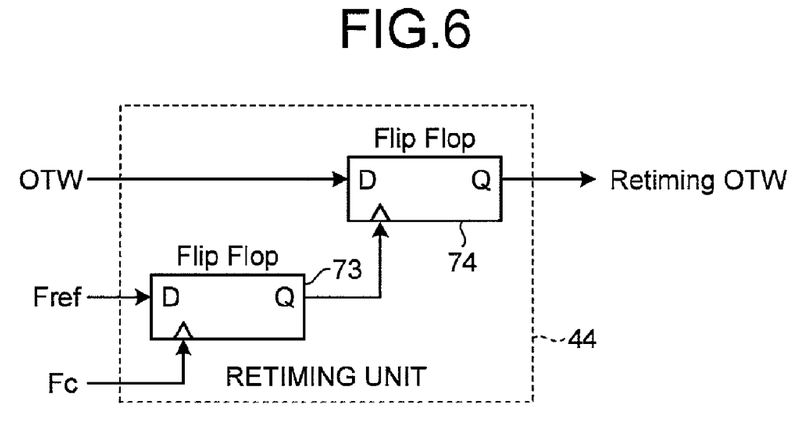
FIG. 6 is a diagram illustrating the retiming unit shown in FIG. 5.

FIG. 5 is a diagram illustrating a semiconductor integrated circuit including a retiming unit. FIG. 6 is a diagram illustrating the retiming unit. In the following explanation, components same as those of the semiconductor integrated circuit 200 shown in FIG. 2 are denoted by the same reference numerals and signs and explanation of the components is omitted. Only differences are explained below.

A semiconductor integrated circuit 201 shown in FIG. 5 includes the integration processing unit 150, the adder 20, the filter unit 151, the gain adjusting unit 152, the oscillation-frequency-signal generating unit 153, the phase-data output unit 154, and the selector counter 130. The oscillation-frequency-signal generating unit 153 shown in FIG. 5 includes a plurality of retiming units 44 shown in FIG. 6. Retiming units 44-1 to 44-n respectively synchronize the reference frequency Fref with the oscillation frequencies Fc1 to Fcn and adjust timing of the oscillator tuning words OTW1 to OTWn input to the oscillators 50-1 to 50-n.

The retiming unit 44 shown in FIG. 6 is equivalent to the retiming units 44-1 to 44-n shown in FIG. 2 and includes flip-flops (FFs) 73 and 74. The reference frequency Fref is input to a data terminal D of the FF 73. The oscillation frequency Fc is input to a clock terminal of the FF 73. A clock signal synchronized with the oscillation frequency Fc is output from an output terminal Q of the FF 73. The oscillation tuning word OTW from the multiplier 40 is input to a data terminal D of the FF 74. The clock signal from the FF 73 is input to a clock terminal of the FF 74. A signal (a retiming OTW) synchronized with the clock signal is output from an output terminal Q of the FF 74. The retiming unit 44 synchronizes the reference frequency Fref with the oscillation frequency Fc and adjusts timing of the oscillator tuning word OTW input to the oscillator 50.

The operation of the semiconductor integrated circuit 201 shown in FIG. 5 is explained below. In the integration processing unit 150, the input selector 11 subjects integration values of the frequency setting data Fcw1 to Fcwn integrated by the integrators 10-1 to 10-n to time division and outputs an integration value to the adder 20.

In the phase-data output unit 154, the input selector 14 subjects phase data from the phase-data output units 100-1 to 100-n to time division and outputs the phase data to the adder 20.

The adder 20 outputs a difference value obtained by subtracting the integration value from the phase data to the filter unit 151.

The filter unit 151 filters the difference value and outputs the difference value to the gain adjusting unit 152 as the normalized tuning word NTW.

The gain adjusting unit 152 multiplies the normalized tuning word NTW with the coefficient from the input selector 13 and allocates the normalized tuning word NTW to the retiming units 44-1 to 44-n as the oscillator tuning words OTW1 to OTWn.

In the oscillation-frequency-signal generating unit 153, the retiming units 44-1 to 44-n adjust the oscillator tuning words OTW1 to OTWn. The oscillators 50-1 to 50-n respectively output the oscillation frequencies Fc1 to Fcn not correlated to one another.

As explained above, in the semiconductor integrated circuit 201 shown in FIG. 5, the filter unit 151 and the gain adjusting unit 152 are commonly used in the ADPLL including a plurality of systems to control timing of output. Therefore, the semiconductor integrated circuit 201 can output the oscillation frequencies Fc1 to Fcn not correlated to one another. Because the semiconductor integrated circuit 201 includes the retiming units 44-1 to 44-$n$, the semiconductor integrated circuit 201 can adjust timing of the oscillator tuning words OTW1 to OTWn input to the oscillators 50-1 to 50-$n$. As a result, the semiconductor integrated circuit 201 can accurately output the oscillation frequencies Fc1 to Fcn not correlated to one another.

Figure 7:
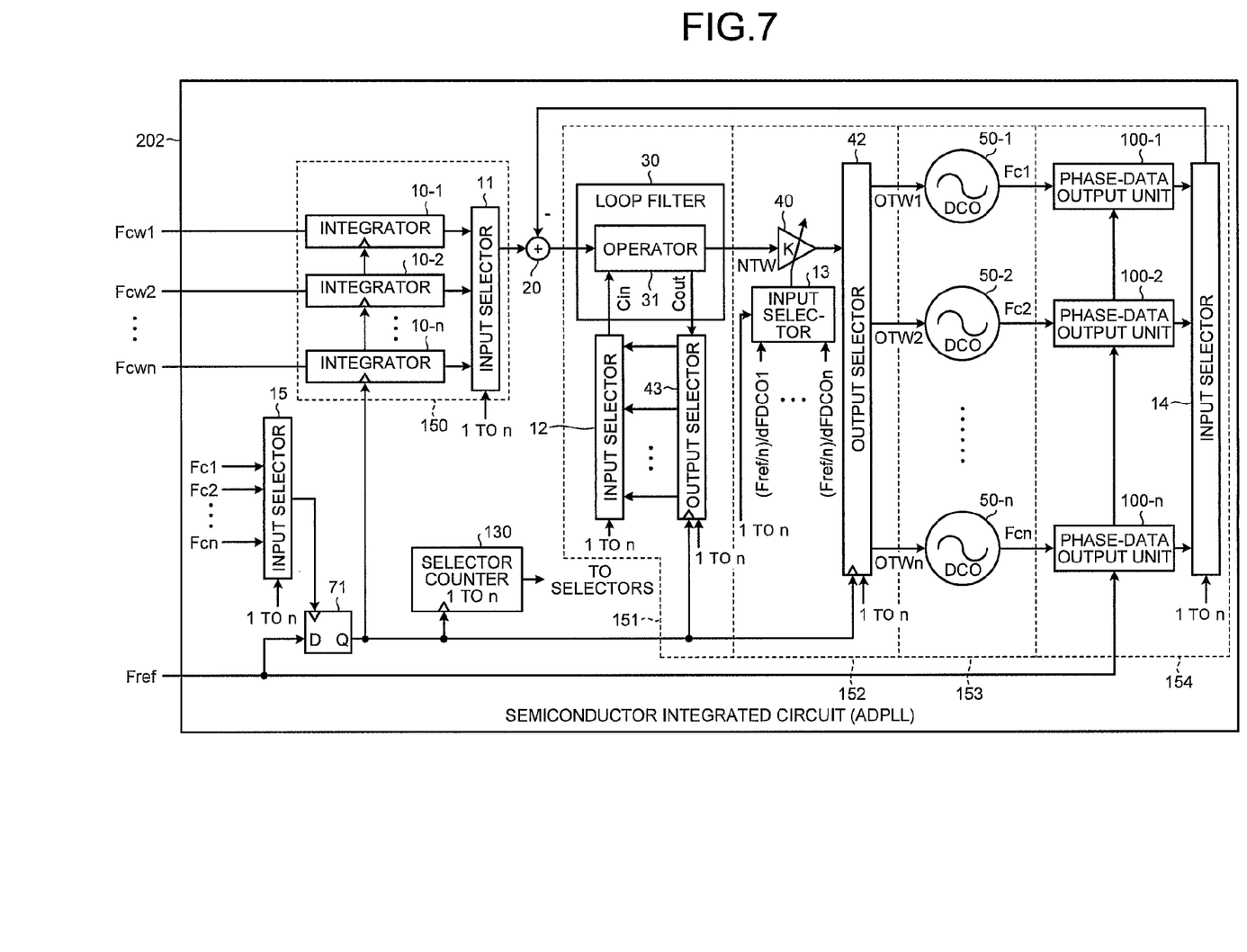
FIG. 7 is a diagram illustrating a semiconductor integrated circuit that controls retiming of a clock system shown in FIG. 6.

FIG. 7 is a diagram illustrating a semiconductor integrated circuit that controls retiming of a clock system shown in FIG. 5. In the following explanation, components same as those of the semiconductor integrated circuit 201 shown in FIG. 5 are denoted by the same reference numerals and signs and explanation of the components is omitted. Only differences are explained below.

A semiconductor integrated circuit 202 shown in FIG. 7 includes the integration processing unit 150, the adder 20, the filter unit 151, the gain adjusting unit 152, the oscillation-frequency-signal generating unit 153, the phase-data output unit 154, the selector counter 130, an input selector 15, and an FF 71. The semiconductor integrated circuit 202 is different from the semiconductor integrated circuit 201 shown in FIG. 5 in that the input selector 15 and the FF 71 are added and an output from the FF 71 is input to the selector counter 130, the filter unit 151, and the gain adjusting unit 152.

The input selector 15 switches an oscillation signal corresponding to the select values 1 to n and outputs the oscillation signal to the FF 71. The reference frequency Fref is input to a data terminal D of the FF 71. The signal from the input selector 15 is input to a clock terminal of the FF 71. The reference frequency Fref synchronized with the signal from the input selector 15 is output from an output terminal Q of the FF 71. The output of the FF 71 is input to the selector counter 130, the output selector 43, and the output selector 42. In this way, the reference frequency Fref is subjected to retiming according to the signal from the input selector 15. This makes it possible to adjust timing of the reference frequency Fref input to the selector counter 130, the output selector 43, and the output selector 42.

The operation of the semiconductor integrated circuit 202 shown in FIG. 7 is explained below. In the integration processing unit 150, the input selector 11 subjects integration values of the frequency setting data Fcw1 to Fcwn integrated by the integrators 10-1 to 10-$n$ to time division in synchronization with the reference frequency Fref from the FF 71 and outputs an integration value to the adder 20.

In the phase-data output unit 154, the input selector 14 subjects phase data from the phase-data output units 100-1 to 100-$n$ to time division and outputs the phase data to the adder 20.

The adder 20 outputs a difference value obtained by subtracting the integration value from the phase data to the filter unit 151. The filter unit 151 filters the difference value and outputs the difference value to the gain adjusting unit 152 as the normalized tuning word NTW.

The gain adjusting unit 152 multiplies the normalized tuning word NTW with the coefficient from the input selector 13 and allocates the normalized tuning word NTW to the oscillators 50-1 to 50-$n$ as the oscillator tuning words OTW1 to OTWn. The oscillators 50-1 to 50-$n$ output, according to the oscillator tuning words OTW1 to OTWn, the oscillation frequencies Fc1 to Fcn not correlated to one another.

As explained above, in the semiconductor integrated circuit 202 shown in FIG. 7, the filter unit 151 and the gain adjusting unit 152 are commonly used in the ADPLL including a plurality of systems to control timing of output. Therefore, the semiconductor integrated circuit 202 can output the oscillation frequencies Fc1 to Fcn not correlated to one another. Because the semiconductor integrated circuit 202 includes the FF 71 that subjects the reference frequency Fref to retiming according to the signal from the input selector 15, the semiconductor integrated circuit 202 can adjust timing of the reference frequency Fref input to the selector counter 130, the output selector 43, and the output selector 42. As a result, the semiconductor integrated circuit 202 can accurately output the oscillation frequencies Fc not correlated to one another.

The semiconductor integrated circuit 202 does not include the retiming unit 44. However, like the semiconductor integrated circuit 201 shown in FIG. 5, the semiconductor integrated circuit 202 may include the retiming unit 44. Therefore, the semiconductor integrated circuit 202 can accurately adjust timing of the oscillator tuning words OTW1 to OTWn input to the oscillators 50-1 to 50-$n$. As a result, the semiconductor integrated circuit 202 can accurately output the oscillation frequencies Fc1 to Fcn not correlated to one another.

Figure 8:
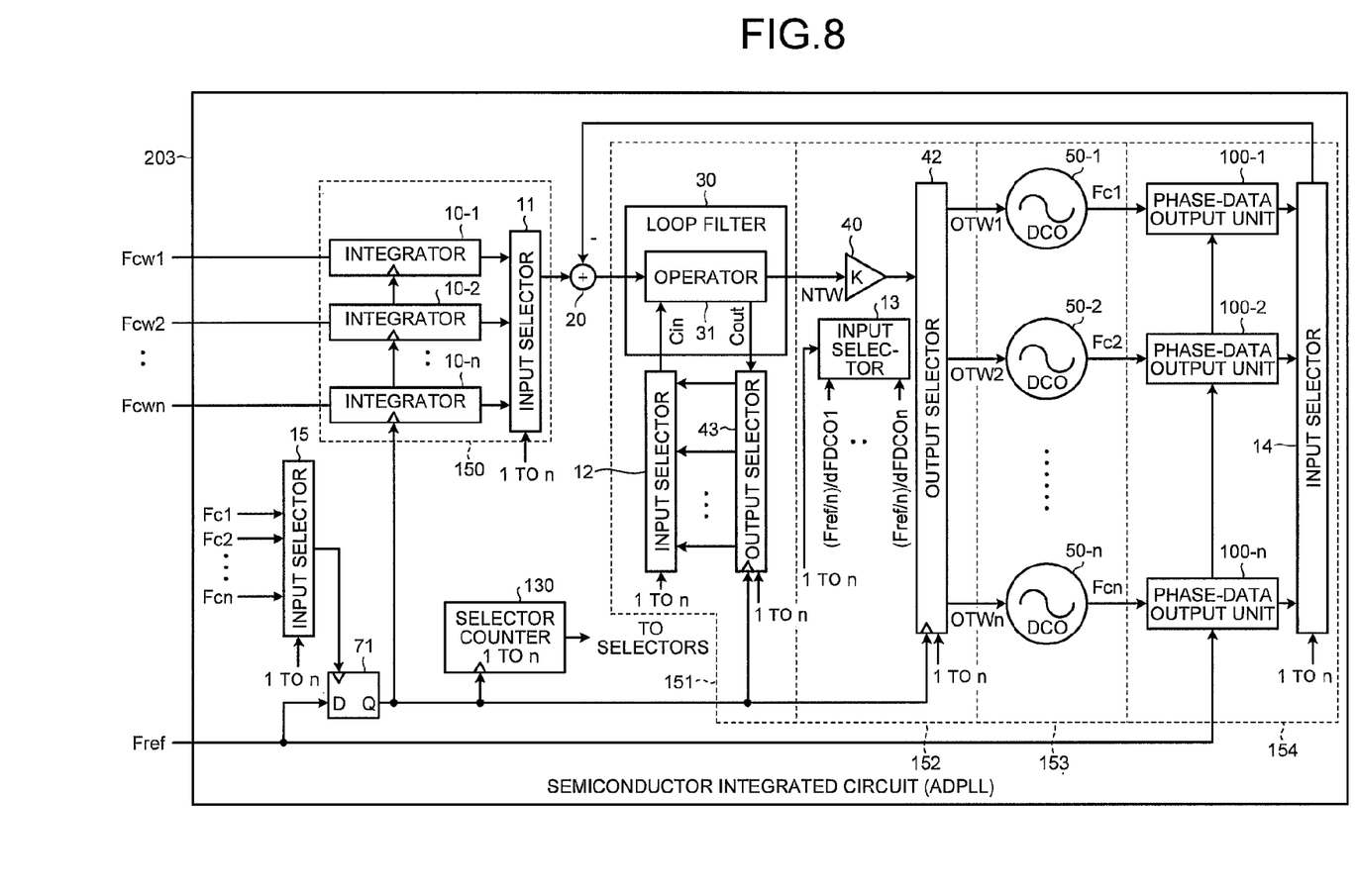
FIG. 8 is a diagram illustrating the semiconductor integrated circuit shown in FIG. 7 in which gain adjustment is unnecessary.

FIG. 8 is a diagram illustrating the semiconductor integrated circuit shown in FIG. 7 in which gain adjustment is unnecessary. Components same as those of the semiconductor integrated circuit 202 shown in FIG. 7 are denoted by the same reference numerals and signs and explanation of the components is omitted.

The operation of a semiconductor integrated circuit 203 shown in FIG. 8 is explained below. In the integration processing unit 150, the input selector 11 subjects integration values of the frequency setting data Fcw1 to Fcwn integrated by the integrators 10-1 to 10-$n$ to time division in synchronization with the reference frequency Fref from the FF 71 and outputs an integration value to the adder 20.

In the phase-data output unit 154, the input selector 14 subjects phase data from the phase-data output units 100-1 to 100-$n$ to time division and outputs the phase data to the adder 20.

The adder 20 outputs a difference value obtained by subtracting the integration value from the phase data to the filter unit 151. The filter unit 151 filters the difference value and outputs the difference value to the gain adjusting unit 152 as the normalized tuning word NTW.

The gain adjusting unit 152 multiplies the normalized tuning word NTW with a predetermined coefficient and allocates the normalized tuning word NTW to the oscillators 50-1 to 50-$n$ as the oscillator tuning words OTW1 to OTWn. The oscillators 50-1 to 50-$n$ output, according to the oscillator tuning words OTW1 to OTWn, the oscillation frequencies Fc1 to Fcn not correlated to one another.

As explained above, in the semiconductor integrated circuit 203 shown in FIG. 8, the filter unit 151 and the gain adjusting unit 152 are commonly used in the ADPLL including a plurality of systems to control timing of output. Therefore, the semiconductor integrated circuit 202 can output the oscillation frequencies Fc1 to Fcn not correlated to one another. Because the semiconductor integrated circuit 203 includes the FF 71 that subjects the reference frequency Fref to retiming according to the signal from the input selector 15, the semiconductor integrated circuit 202 can adjust timing of the reference frequency Fref input to the selector counter 130, the output selector 43, and the output selector 42. As a result, the semiconductor integrated circuit 202 can accurately output the oscillation frequencies Fc not correlated to one another. Further, in the semiconductor integrated circuit 203, since gain adjustment is unnecessary, arithmetic processing for adjusting a gain of the multiplier 40 is reduced. As a result, it is possible to increase the oscillation frequency Fc.

The semiconductor integrated circuit 203 does not include the retiming unit 44. However, like the semiconductor integrated circuit 201 shown in FIG. 5, the semiconductor integrated circuit 203 may include the retiming unit 44. With such a configuration, the semiconductor integrated circuit 203 can accurately adjust timing of the oscillator tuning words OTW1 to OTWn input to the oscillators 50-1 to 50-$n$. As a result, the semiconductor integrated circuit 203 can accurately output the oscillation frequencies Fc1 to Fcn not correlated to one another.

As explained above, in the semiconductor integrated circuits 200 to 203 according to the first embodiment, the TDC 60 and the redundant arithmetic units are commonly used to subject phase data from the oscillators 50 to time division processing using a basic ADPLL. Therefore, it is possible to obtain a plurality of output frequencies not correlated to one another while minimizing an increase in an area of a semiconductor integrated circuit.

Second Embodiment

Figure 9:
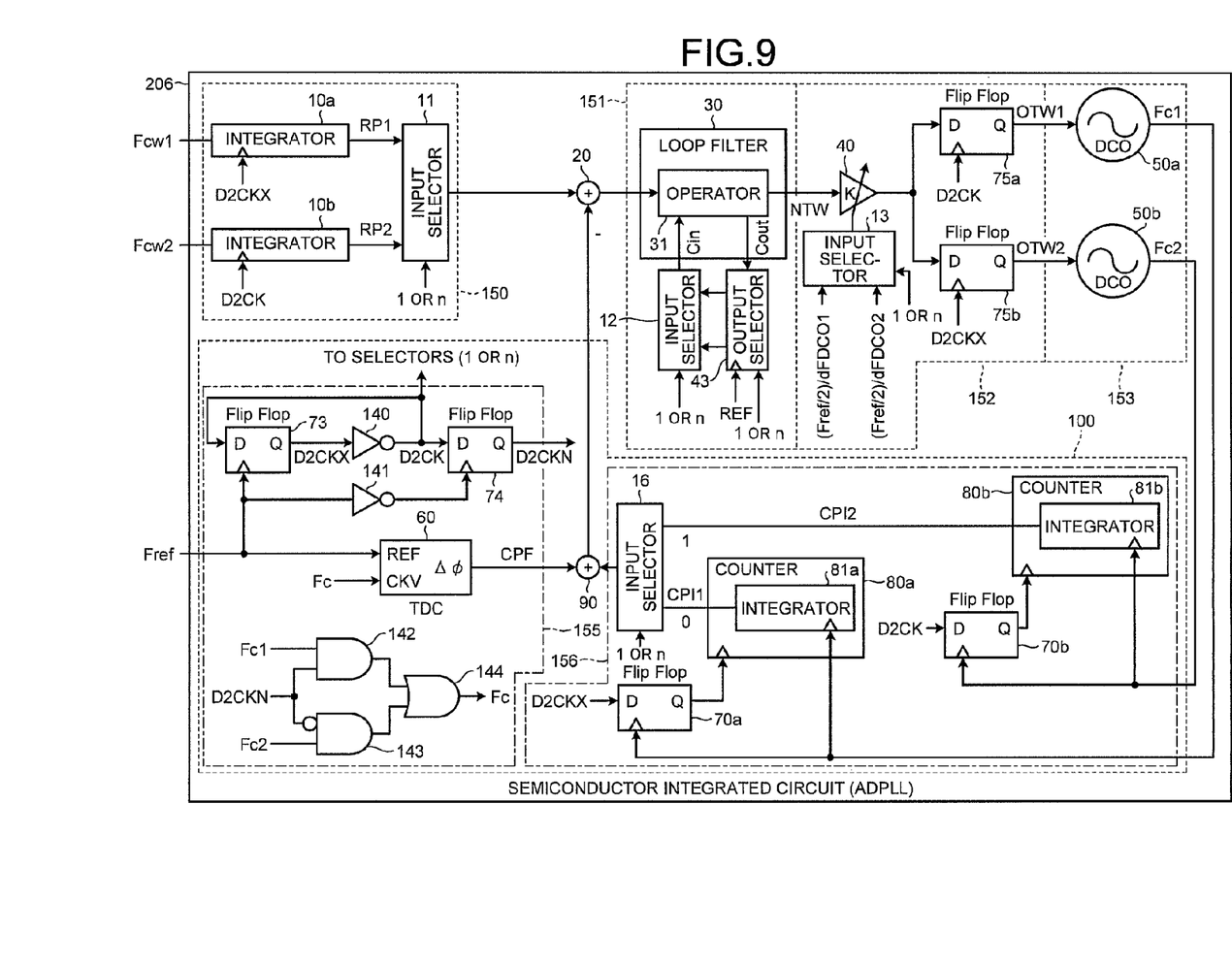
FIG. 9 is a diagram illustrating a semiconductor integrated circuit according to a second embodiment of the present invention.

FIG. 9 is a diagram illustrating a semiconductor integrated circuit according to a second embodiment of the present invention. In a semiconductor integrated circuit 206 shown in FIG. 9, a TDC of a phase-data output unit in an ADPLL including two systems are commonly used. The semiconductor integrated circuit 206 shown in FIG. 9 includes the integration processing unit 150, the adder 20, the filter unit 151, the gain adjusting unit 152, the oscillation-frequency-signal generating unit 153, and a phase-data output unit 100.

The oscillation-frequency-signal generating unit 153 includes an oscillator 50a (a first digitally controlled oscillator), the oscillation frequency Fc1 of a first oscillation signal of which is controlled according to the oscillator tuning word OTW1 (a first oscillator tuning word), and an oscillator 50b (a second digitally controlled oscillator), the oscillation frequency Fc1 of a second oscillation signal of which is controlled according to an oscillator tuning word OTW2.

The filter unit 151 filters a difference value between first phase data and a first integration value in synchronization with the reference frequency Fref and filters a difference value between second phase data and a second integration value in synchronization with the reference signal Fref.

The gain adjusting unit 152 includes the multiplier 40, the input selector 13, and FFs 75a and 75b. The gain adjusting unit 152 outputs a value obtained by multiplying an output signal from the filter unit 151 with a first coefficient to the oscillator 50a as the oscillator tuning word OTW1 and outputs a value obtained by multiplying the output signal from the filter unit 151 with a second coefficient to the oscillator 50b as the oscillator tuning word OTW2.

The phase-data output unit 100 includes a first processing unit 155, a second processing unit 156, and an adder (a second multiplier) 90. The phase-data output unit 100 outputs phase data that is an added-up value of a first count value CPI1 obtained by counting the number of waves of a first oscillation signal, a second count value CPI2 obtained by counting the number of waves of a second oscillation signal, and a phase difference between a third oscillation frequency Fc based on oscillation signals of the first oscillation signal and the second oscillation signal and the reference frequency Fref.

In the semiconductor integrated circuit 206, the TDC 60 is commonly used with respect to the oscillation frequencies Fc1 and Fc2 from the oscillators 50a and 50b.

In the first processing unit 155, the FF 73 outputs, based on the reference frequency Fref, a first reference signal D2CKX to a NOT circuit 140. A second reference signal D2CK as an output of the NOT circuit 140 is input to the data terminal D of the FF 74. The reference frequency Fref inverted by a NOT circuit 140 is input to the clock terminal of the FF 74. The FF 74 outputs a third reference signal D2CKN based on the inverted reference frequency Fref.

The oscillation frequency Fc1 and the third reference signal D2CKN are input to an AND circuit 142. The oscillation frequency Fc2 is input to an AND circuit 143. A third reference signal D2CKN is inversely input to the AND circuit 143. Outputs of the AND circuits 142 and 143 are input to an OR circuit 144. The OR circuit 144 outputs one of the outputs to the TDC 60 as the oscillation frequency Fc.

The TDC 60 outputs, as a signal CPF, a phase difference Δφ between the reference frequency Fref and the oscillation frequency Fc from the OR circuit 144.

The second processing unit 156 includes a counter 80a (a first counter), a counter 80b (a second counter), FFs 70a and 70b, and an input selector (a count-value switching unit) 16. The first reference signal D2CKX from the FF 73 is input to a data terminal D of the FF 70a. The oscillation frequency Fc1 is input to a clock terminal of the FF 70a. A reference signal is output from an output terminal Q of the FF 70a in synchronization with the oscillation frequency Fc1. The counter 80a counts the number of waves of the oscillation frequency Fc1 and outputs the first count value CPI1 in synchronization with the reference signal from the FF 70a.

The second reference signal D2CK from the NOT circuit 140 is input to a data terminal D of the FF 70b. The oscillation frequency Fc2 is input to a clock terminal of the FF 70b. A reference signal is output from an output terminal Q of the FF 70b in synchronization with the oscillation frequency Fc2. The counter 80b counts the number of waves of the oscillation frequency Fc2 and outputs the second count value CPI2 in synchronization with the reference signal from the FF 70b.

The input selector 16 switches a count value to the first count value CPI1 or the second count value CIP2 in response to a select value (the second reference signal D2CK) and outputs a count value subjected to time division to the adder 90. The adder 90 outputs phase data obtained by adding up the count value from the input selector 16 and the phase difference from the TDC 60.

In the gain adjusting unit 152, an output from the multiplier 40 is input to a data terminal D of the FF 75a. The second reference signal D2CK is input to a clock terminal of the FF 75a. The oscillator tuning word OTW1 synchronized with the second reference signal D2CK is output from an output terminal W of the FF 75a.

The output from the multiplier 40 is input to a data terminal D of the FF 75b. The first reference signal D2CKX is input to a clock terminal of the FF 75b. The oscillator tuning word OTW2 synchronized with the first reference signal D2CKX is output from an output terminal Q of the FF 75b.

Figure 10:
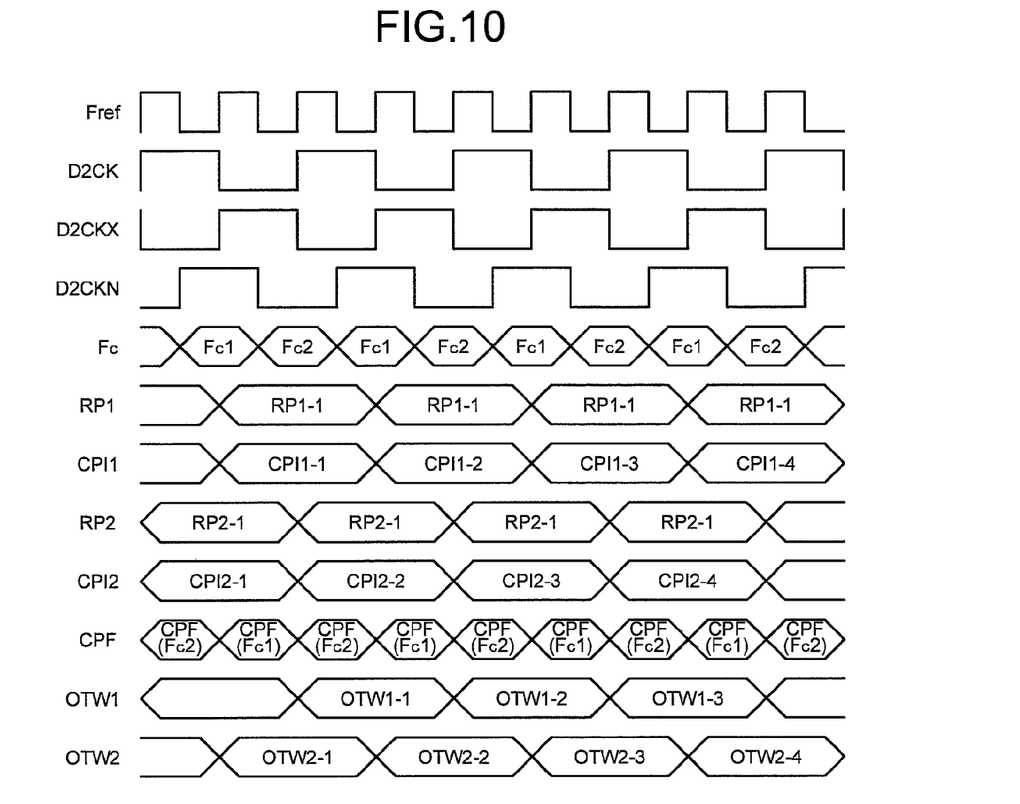
FIG. 10 is a timing chart of an ADPLL shown in FIG. 9.

FIG. 10 is a timing chart of the ADPLL shown in FIG. 9. The operation of the semiconductor integrated circuit 206 shown in FIG. 9 is explained below with reference to FIG. 10. In the integration processing unit 150, the input selector 11 subjects an integration value obtained by synchronizing the frequency setting data Fcw1 (the first oscillator tuning word) with the first reference signal D2CKX and an integration value obtained by synchronizing the frequency setting data Fcw2 (the second oscillator tuning word) with the second reference signal D2CK to time division and outputs an integration value to the adder 20.

In the first processing unit 155, as shown in FIG. 10, the reference frequency Fref is at H, an output of the FF 141 is at L, the output D2CKX of the FF 73 is at L, and the output D2CK of the NOT circuit 140 at H. When the reference frequency Fref changes to L, the output D2CKN of the FF 74 changes to H. Therefore, an oscillation frequency from the OR circuit 144 changes to Fc1. Then, the reference frequency Fref is at H, the output of the FF 141 is at L, the output D2CKX of the FF 73 is at H, and the output D2CK of the NOT circuit 140 is at L. When the reference frequency Fref changes to L, the output D2CKN of the FF 74 changes to L. Therefore, the oscillation frequency from the OR circuit 144 changes to Fc2.

In the second processing unit 156, the counter 80a outputs first count values CPI1-1 to CPI1-4 at a period of D2CKX. The counter 80b outputs second count values CPI2-1 to CPI2-4 at a period of D2CK. The input selector 16 outputs the first and second count values CPI1 and CPI2 to the adder 90 according to a select value (the second reference signal D2CK) from the first processing unit 155.

The adder 90 adds up the count value from the input selector 15 with the phase difference Δϕ and outputs an added-up value to the adder 20 as phase data.

The adder 20 outputs a difference value obtained by subtracting the integration value from the phase data to the filter unit 151.

The filter unit 151 filters the difference value and outputs the difference value to the gain adjusting unit 152 as the normalized tuning word NTW.

The gain adjusting unit 152 multiplies the normalized tuning word NTW with the coefficient from the input selector 13 and allocates the normalized tuning word NTW to the FFs 75a and 75b. The FF 75a outputs the normalized tuning word NTW to the oscillator 50a as the oscillator tuning word OTW1 synchronized with the second reference signal D2CK. The FF 75b outputs the standardized tuning word NTW to the oscillator 50b as the oscillator tuning word OTW2 synchronized with the output D2CKX. The oscillators 50a and 50b output the oscillation frequencies Fc1 and Fc2 not correlated to each other.

As explained above, in the semiconductor integrated circuit 206 shown in FIG. 9, the filter unit 151, the gain adjusting unit 152, and the TDC 60 are commonly used. Therefore, the semiconductor integrated circuit 206 can output the oscillation frequencies Fc1 and Fc2 not correlated to each other. Because the TDC 60 is commonly used, a further reduction in size of the semiconductor integrated circuit 206 can be realized compared with a semiconductor integrated circuit 204 and a semiconductor integrated circuit 205.

Third Embodiment

Figure 11:
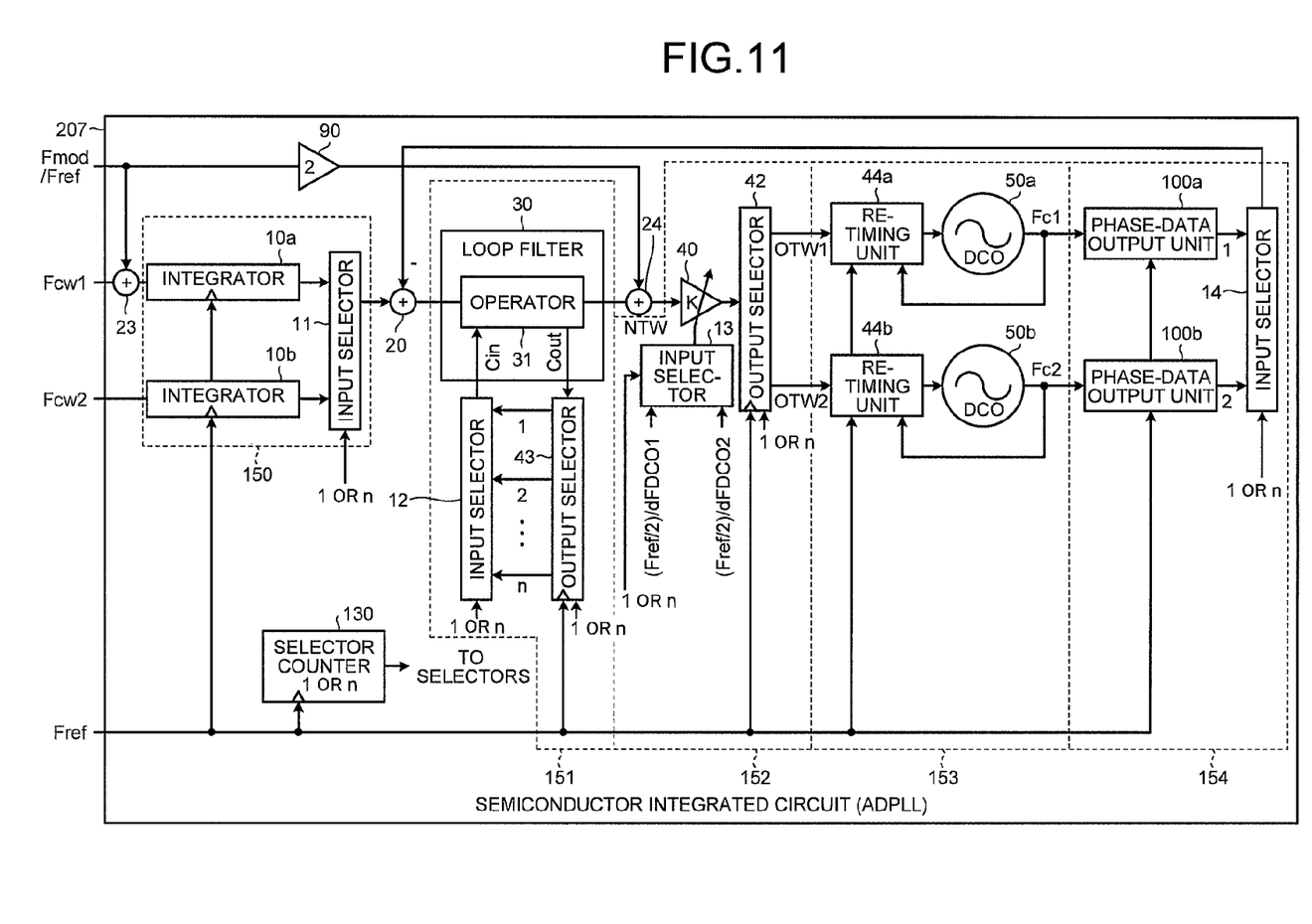
FIG. 11 is a diagram illustrating a semiconductor integrated circuit according to a third embodiment of the present invention.

In a semiconductor integrated circuit 207 according to a third embodiment of the present invention, an ADPLL including two systems is formed. One system performs modulating operation and the other system outputs a fixed frequency. Components same as those of the semiconductor integrated circuits 200 to 206 according to the first and second embodiments are denoted by the same reference numerals and signs and explanation of the components is omitted.

FIG. 11 is a diagram illustrating the semiconductor integrated circuit according to the third embodiment. The semiconductor integrated circuit 207 shown in FIG. 11 includes the multiplier 90, adders 20, 23, and 24, the integration processing unit 150, the filter unit 151, the gain adjusting unit 152, the oscillation-frequency-signal generating unit 153, the phase-data output unit 154, and the selector counter 130. The semiconductor integrated circuit 207 can output the oscillation frequencies Fc1 and Fc2, and the multiplier 90, the adder 23, and the adder 24 are added thereto.

The phase-data output unit 154 outputs first phase data that is an added-up value of a count value obtained by counting the number of waves of a first oscillation signal and a phase difference between the oscillation frequency Fc1 of the first oscillation signal and the reference frequency Fref. The phase-data output unit 154 also outputs second phase data that is an added-up value of a count value obtained by counting the number of waves of a second oscillation signal and a phase difference between the oscillation frequency Fc2 of the second oscillation signal and the reference frequency Fref.

The integration processing unit 150 includes an integrator 10a that outputs a first integration value of an output from the adder 23 in synchronization with the reference frequency Fref and an integrator 10b that outputs a second integration value of the second frequency setting data Fcw2 in synchronization with the reference frequency Fref.

The multiplier 90 outputs a value obtained by multiplying modulated frequency data (Fmod/Fref) with a predetermined coefficient. The adder 23 outputs, for example, a value obtained by adding the modulated frequency data to the frequency setting data Fcw1 to the integrator 10a. The adder 24 adds the output from the multiplier 90 to an output of the loop filter 30 and outputs an added-up value to the gain adjusting unit 152.

The operation of the semiconductor integrated circuit 207 shown in FIG. 11 is explained below. In the integration processing unit 150, the input selector 11 subjects integration values integrated by the integrators 10a and 10b to time division in synchronization with the reference frequency Fref and outputs the integration value to the adder 20.

The phase-data output unit 154 subjects phase data from phase-data output units 100a and 100b to time division and outputs the phase data to the adder 20.

The adder 20 outputs a difference value obtained by subtracting the integration value from the phase data to the filter unit 151. The filter unit 151 filters the difference value and outputs the difference value to the adder 24 as the normalized tuning word NTW.

The adder 24 adds the output from the multiplier 90 to the output of the loop filter 30 and outputs the added-up value to the gain adjusting unit 152.

The gain adjusting unit 152 multiplies the normalized tuning word NTW with a predetermined coefficient and allocates the normalized tuning word NTW to retiming units 44a and 44b as the oscillator tuning words OTW1 and OTW2.

In the oscillation-frequency-signal generating unit 153, the retiming units 44a and 44b adjust the oscillator tuning values OTW1 and OTW2. The oscillators 50a and 50b output the oscillation frequencies Fc1 to Fcn not correlated to each other.

In this embodiment, a configuration example in which the adder 23, the adder 24, and the multiplier 90 are applied to the semiconductor integrated circuit including the two phase-data output units. However, the present invention is not limited to this. The adder 23, the adder 24, and the multiplier 90 can also be applied to the semiconductor integrated circuit 206 shown in FIG. 9.

As explained above, in the semiconductor integrated circuit 207 according to this embodiment, the filter unit 151 and the gain adjusting unit 152 are commonly used in the ADPLL including two systems. The semiconductor integrated circuit 207 includes the multiplier 90, the adder 23, and the adder 24. Therefore, one system (e.g., a loop of the oscillator 50a) can perform frequency modulating operation and the other system (e.g., a loop of the oscillator 50b) can output a fixed frequency. As a result, because the semiconductor integrated circuit 207 includes the different systems, in addition to the effect of the second embodiment, it is possible to cause, while subjecting one system to frequency modulation, the other system to oscillate at the fixed frequency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
an oscillation-frequency-signal generating unit that comprises a plurality of digitally controlled oscillators, oscillation frequencies of oscillation signals of which are controlled according to an oscillator tuning word;
a phase-data output unit that outputs a plurality of phase data that are added up count values obtained by counting numbers of waves of the oscillation signals and phase differences between the oscillation frequencies of the oscillation signals and a reference frequency;
an integration processing unit that outputs integration values of frequency setting data of the digitally controlled oscillators in synchronization with the reference frequency;
a filter unit that filters a difference value, in synchronization with the reference frequency, between the phase data from the phase-data output unit and the integration value from the integration processing unit; and
a gain adjusting unit that outputs the oscillator tuning word obtained by multiplying output signals from the filter unit with a predetermined coefficient to the oscillation-frequency-signal generating unit as in synchronization with the reference frequency.

2. The semiconductor integrated circuit according to claim 1, wherein the integration processing unit outputs, based on a selection signal synchronized with the reference frequency, any one of the integration values.

3. The semiconductor integrated circuit according to claim 2, wherein the gain adjusting unit switches the coefficient based on the selection signal and outputs the oscillator tuning word to a predetermined one of the digitally controlled oscillators.

4. The semiconductor integrated circuit according to claim 3, wherein the phase-data output unit outputs any one of the phase data based on the selection signal.

5. The semiconductor integrated circuit according to claim 1, wherein the oscillation-frequency-signal generating unit comprises an oscillator-tuning-word adjusting unit that adjusts timing of the oscillator tuning word from the gain adjusting unit by synchronizing oscillation frequencies fed back from the digitally controlled oscillators with the reference frequency.

6. The semiconductor integrated circuit according to claim 1, further comprising a multiplier that outputs a modulation frequency tuning word obtained by multiplying modulation frequency data with a predetermined coefficient, the modulation frequency data being obtained by dividing a modulation frequency by the reference frequency, wherein
the integration processing unit outputs an integration value of frequency setting data of one of the digitally controlled oscillators to which the modulation frequency data is added, and
the filter unit filters the difference value and outputs an output signal, to which the modulation frequency tuning word is added, to the gain adjusting unit.

7. A semiconductor integrated circuit comprising:
an oscillation-frequency-signal generating unit that comprises a first digitally controlled oscillator, an oscillation frequency of a first oscillation signal of which is controlled according to a first oscillator tuning word and a second digitally controlled oscillator, an oscillation frequency of a second oscillation signal of which is controlled according to a second oscillator tuning word;
a phase-data output unit that outputs first and second phase data that are added up count values obtained by counting a number of waves of the first or second oscillation signal and a phase difference between the oscillation frequency of the first or second oscillation signal and a reference frequency;
an integration processing unit that outputs a first integration value of a first frequency setting data and a second integration value of a second frequency setting data in synchronization with the reference frequency;
a filter unit that filters a difference value between the first or second phase data and the first or second integration value in synchronization with the reference frequency; and
a gain adjusting unit that outputs the first and second oscillator tuning words obtained by multiplying an output signal from the filter unit with first or second coefficients to the first and second digitally controlled oscillators.

8. The semiconductor integrated circuit according to claim 7, wherein the integration processing unit outputs, based on a selection signal synchronized with the reference frequency, any one of the integration values.

9. The semiconductor integrated circuit according to claim 8, wherein the gain adjusting unit switches the coefficient based on the selection signal and outputs the oscillator tuning word to a predetermined one of the digitally controlled oscillators.

10. The semiconductor integrated circuit according to claim 9, wherein the phase-data output unit outputs any one of the phase data based on the selection signal.

11. The semiconductor integrated circuit according to claim 7, wherein the oscillation-frequency-signal generating unit comprises an oscillator-tuning-word adjusting unit that adjusts timing of the oscillator tuning word from the gain adjusting unit by synchronizing oscillation frequencies fed back from the digitally controlled oscillators with the reference frequency.

12. The semiconductor integrated circuit according to claim 7, further comprising a multiplier that outputs a modulation frequency tuning word obtained by multiplying modulation frequency data with a predetermined coefficient, the modulation frequency data being obtained by dividing a modulation frequency by the reference frequency, wherein
the integration processing unit outputs the integration value of the first frequency setting data to which the modulation frequency data is added, and
the filter unit filters the difference value and outputs an output signal, to which the modulation frequency tuning word is added, to the gain adjusting unit.

13. A semiconductor integrated circuit comprising:
an oscillation-frequency-signal generating unit that comprises a first digitally controlled oscillator, an oscillation frequency of a first oscillation signal of which is controlled according to a first oscillator tuning word and a second digitally controlled oscillator, an oscillation frequency of a second oscillation signal of which is controlled according to a second oscillator tuning word;
a phase-data output unit that outputs first and second phase data that are added up count values obtained by counting a number of waves of the first or second oscillation signal and a phase difference between a third oscillation frequency based on the first and second oscillation signals and a reference frequency;
an integration processing unit that outputs a first integration value of a first frequency setting data and a second integration value of a second frequency setting data in synchronization with the reference frequency;
a filter unit that filters a difference value between the first or second phase data and the first or second integration value in synchronization with the reference frequency; and
a gain adjusting unit that outputs as the first and second oscillator tuning words obtained by multiplying an output signal from the filter unit with first or second coefficients to the first and second digitally controlled oscillators.

14. The semiconductor integrated circuit according to claim 13, wherein the phase-data output unit comprises:
a first counter that counts a number of waves of the first oscillation signal in synchronization with a first reference signal generated based on the reference frequency and outputs the number of waves as a first count value;
a second counter that counts a number of waves of the second oscillation signal in synchronization with a second reference signal generated based on the reference frequency and outputs the number of waves as a second count value;
a phase-difference calculating unit that calculates, based on a third reference signal generated based on the reference frequency, a phase difference between the third oscillation frequency and the reference frequency;
a count-value switching unit that outputs the first or second count value based on a selection signal synchronized with the reference frequency; and
an adder outputs the phase data that added up the first or second count value and the phase difference.

15. The semiconductor integrated circuit according to claim 13, wherein the integration processing unit outputs, based on a selection signal synchronized with the reference frequency, any one of the integration values.

16. The semiconductor integrated circuit according to claim 15, wherein the gain adjusting unit switches the first and second coefficients based on the selection signal and outputs the oscillator tuning word to a predetermined one of the digitally controlled oscillators.

17. The semiconductor integrated circuit according to claim 16, wherein the phase-data output unit outputs any one of the phase data based on the selection signal.

18. The semiconductor integrated circuit according to claim 13, wherein the oscillation-frequency-signal generating unit comprises an oscillator-tuning-word adjusting unit that adjusts timing of the oscillator tuning word from the gain adjusting unit by synchronizing oscillation frequencies fed back from the digitally controlled oscillators with the reference frequency.

19. The semiconductor integrated circuit according to claim 13, further comprising a multiplier that outputs a modulation frequency tuning word obtained by multiplying modulation frequency data with a predetermined coefficient, the modulation frequency data being obtained by dividing a modulation frequency by the reference frequency, wherein
the integration processing unit outputs an integration value of the first frequency setting data to which the modulation frequency data is added, and
the filter unit filters the difference value and outputs an output signal, to which the modulation frequency tuning word is added, to the gain adjusting unit.

* * * * *